(12) United States Patent
Wadland et al.

(10) Patent No.: US 7,937,681 B2
(45) Date of Patent: May 3, 2011

(54) METHOD AND MECHANISM FOR IMPLEMENTING AUTOMATED PCB ROUTING

(75) Inventors: Ken Wadland, Grafton, MA (US); Richard Allen Woodward, Jr., San Diego, CA (US); Randall Lawson, Westford, MA (US); Walter Katz, Boulder, CO (US); Wiley Gillmor, Boulder, CO (US)

(73) Assignee: Cadence Design Systems, Inc., San Jose, CA (US)

( * ) Notice: Subject to any disclaimer, the term of this patent is extended or adjusted under 35 U.S.C. 154(b) by 632 days.

(21) Appl. No.: 11/115,042

(22) Filed: Apr. 25, 2005

(65) Prior Publication Data

US 2006/0242614 A1    Oct. 26, 2006

(51) Int. Cl.
*G06F 17/50*    (2006.01)
(52) U.S. Cl. .................. 716/129; 716/130; 716/137
(58) Field of Classification Search .............. 716/12–15, 716/129, 130, 137
See application file for complete search history.

(56) References Cited

U.S. PATENT DOCUMENTS

| | | | | |
|---|---|---|---|---|
| 5,801,959 | A * | 9/1998 | Ding et al. | 716/11 |
| 6,353,918 | B1 * | 3/2002 | Carothers et al. | 716/8 |
| 6,957,409 | B1 * | 10/2005 | Teig et al. | 716/12 |
| 7,013,451 | B1 * | 3/2006 | Teig et al. | 716/13 |
| 7,117,468 | B1 * | 10/2006 | Teig et al. | 716/11 |
| 2001/0014965 | A1 * | 8/2001 | Hiraga | 716/13 |
| 2003/0009738 | A1 * | 1/2003 | Wadland et al. | 716/13 |
| 2003/0126578 | A1 * | 7/2003 | Wadland et al. | 716/12 |
| 2005/0114821 | A1 * | 5/2005 | Petunin et al. | 716/15 |
| 2006/0112366 | A1 * | 5/2006 | Wadland et al. | 716/11 |

OTHER PUBLICATIONS

Cong, Jason; "Performance Driven Multi-Layer General Area Routing for PCB/MCM Designs"; Jun. 1998; 35th Design Automation Conference; All Pages.*
Cong et al.; "Performance Driven Multi Layer General Area Routing for PCB MCM Designs"; Jun. 19, 1998; UCLA Computer Science Department; pp. 356-361.*
Dai, W.W.-M. et al. "Topological Routing in SURF: Generating a Rubber-Band Sketch" Proceedings of the 28th Conference on ACM/IEEE Design Automation, San Francisco, CA, 1991, pp. 39-44.
Dai, W.W.-M. et al. "Routability of a Rubber-Band Sketch" Proceedings of the 28th Conference on ACM/IEEE Design Automation, San Francisco, CA, 1991, pp. 45-48.

* cited by examiner

*Primary Examiner* — Sun J Lin
*Assistant Examiner* — Suresh Memula
(74) *Attorney, Agent, or Firm* — Vista IP Law Group LLP (57) ABSTRACT

A method and system that converges on a global solution to a PCB routing problem using iterations of topology-based routing is described. In some embodiments, the geometric design space is abstracted into a topological graph representing the routing problem. Then, each net is allowed to find its optimal solution path independent of the solution paths for all other nets. The electrical and physical constraints of the system are initially ignored or greatly relaxed. Over each design iteration, the constraints are tightened until a complete, global, topological solution is found. Once a topological solution is found, it is converted into a geometric solution. In the event that no geometric solution exists for that topological solution, then the iteration process is resumed taking into consideration this additional information. The result is the ability to quickly autoroute highly-constrained PCB designs with minimal operator input.

20 Claims, 3 Drawing Sheets

METHOD AND MECHANISM FOR IMPLEMENTING AUTOMATED PCB ROUTING

BACKGROUND

As clock rates have increased, the duration of signal rise and fall times has decreased. Inside an IC design where total length is an issue, this causes some of the signals to have transmission line effects. At the PCB level, these same signal speeds result in far more transmission line effects due to the lengths being orders of magnitude larger. Increasingly, a larger percentage of the total nets on a design have both physical and electrical constraints. In older systems where only 10% of the nets on a design had tight constraints, it was possible to route them first or to route them multiple times in an almost random fashion in order to find a solution. In the current state-of-the-art PCB designs, 90% of the nets have both electrical and physical constraints. Therefore, it is impossible to route them all first. Further, iterative processes are unlikely to succeed without taking a global view.

Additionally, there has been a continual increase in the number of pins per package. This has resulted in more buses and hence an increased need for matched track lengths within sets of nets. It is common to require each net in a bus to have the same length as all other nets in the bus to within less than 0.01% tolerance. This means that all of the paths of all of the nets in the bus must travel side-by-side on the same layers. Since these buses can reach 64-bits, they occupy a considerable amount of area on the layer For today's leading-edge, high-speed PCB designs, routing is always done manually by a team of highly experienced PCB designers. Each segment of each track is laid down individually. That is, all of the planning goes on inside the head of the designer. Presently, there is no means to communicate a designer's design plans to an autorouter. As a result, designs that could have been autorouted in an hour without the need to meet electrical constraints take a man-year or more for PCB designers to manually route to meet all of the required physical and electrical constraints.

There is no autorouter on the market today that can autoroute dense designs where 90% of the nets have both physical and electrical constraints.

Present PCB routing systems use a geometry-based routing engine to route individual pin pairs. Generally, they allow crossovers and other violations of physical design rules and then try to eliminate the crossovers and violations by performing multiple iterations. In these systems, each net is considered based on its own design rules and ignores the design rules of all other nets unless they are directly related to the design rules for the current net. Thus, each iteration is a geometric solution with a set of known design rule violations that is derived from the previous iteration which was also a geometric solution with a set of known design rules violations. The convergence process is based on finding new paths for individual nets, one at a time, that result in fewer overall design violations. There is no global planning or solution finding mechanism. When there are many electrical constraints, this process ceases to converge long before a solution can be found or converges so slowly, as to be impractical.

In the digital IC realm, there are many autorouting products that have used global routing for years. Current routers start with a global routing solution and then proceed in stages to route smaller and smaller grids until a complete geometric solution has been found. However, the goal of global routing for digital IC autorouters is performance, not constraint optimization. When routing designs with 100 million gates, there are trillions of potential solutions; the autorouter only needs to find one and it needs to converge quickly on a solution.

Global routing allows the design to be abstracted to provide less detail and manage less data. Once a global solution is found, successive iterations attempt to find solutions within the confines of the global solution. At no point do these systems try to find new global solutions after a first global solution has been found. If the successive iterations do not converge on a solution, then the entire routing process fails and must be restarted. This is rarely a problem with digital IC routers, since these systems can usually insert vias and/or buffers to find a solution. In most cases, the system can also change the original problem by resizing or moving gates.

In PCB routing however, inserting new vias is frequently forbidden by the design rules; and, moving or modifying components is rarely possible. Thus, applying traditional digital IC global routing technology to PCB routing can make the routing problem worse. For PCB routing, committing to a global geometric solution before all constraints were verified at the lowest level only adds artificial constraints to a design that already has too many design constraints.

In order to solve the problem of routing designs in PCBs with many constraints, a global solution is needed that creates a global flow plan meeting all or most of the constraints and then iteratively refining it.

SUMMARY

What is described is a method and system that converges on a global solution to a PCB routing problem using iterations of topology-based routing. In one embodiment, the geometric design space is abstracted into a topological graph representing the routing problem. Then, each net is allowed to find its optimal solution path independent of the solution paths for all other nets. The electrical and physical constraints of the system are initially ignored or greatly relaxed. Over each design iteration, the constraints are tightened until a complete, global, topological solution is found. Once a topological solution is found, it is converted into a geometric solution. In the event that no geometric solution exists for that topological solution, then the iteration process is resumed taking into consideration this additional information. The result is the ability to quickly autoroute highly-constrained PCB designs with minimal operator input.

BRIEF DESCRIPTION OF THE DRAWINGS

The drawings illustrate the design and utility of preferred embodiments of the present invention. It should be noted that the figures are not drawn to scale and that elements of similar structures or functions are represented by like reference numerals throughout the figures. In order to better appreciate how the above-recited and other advantages and objects of the present inventions are obtained, a more particular description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
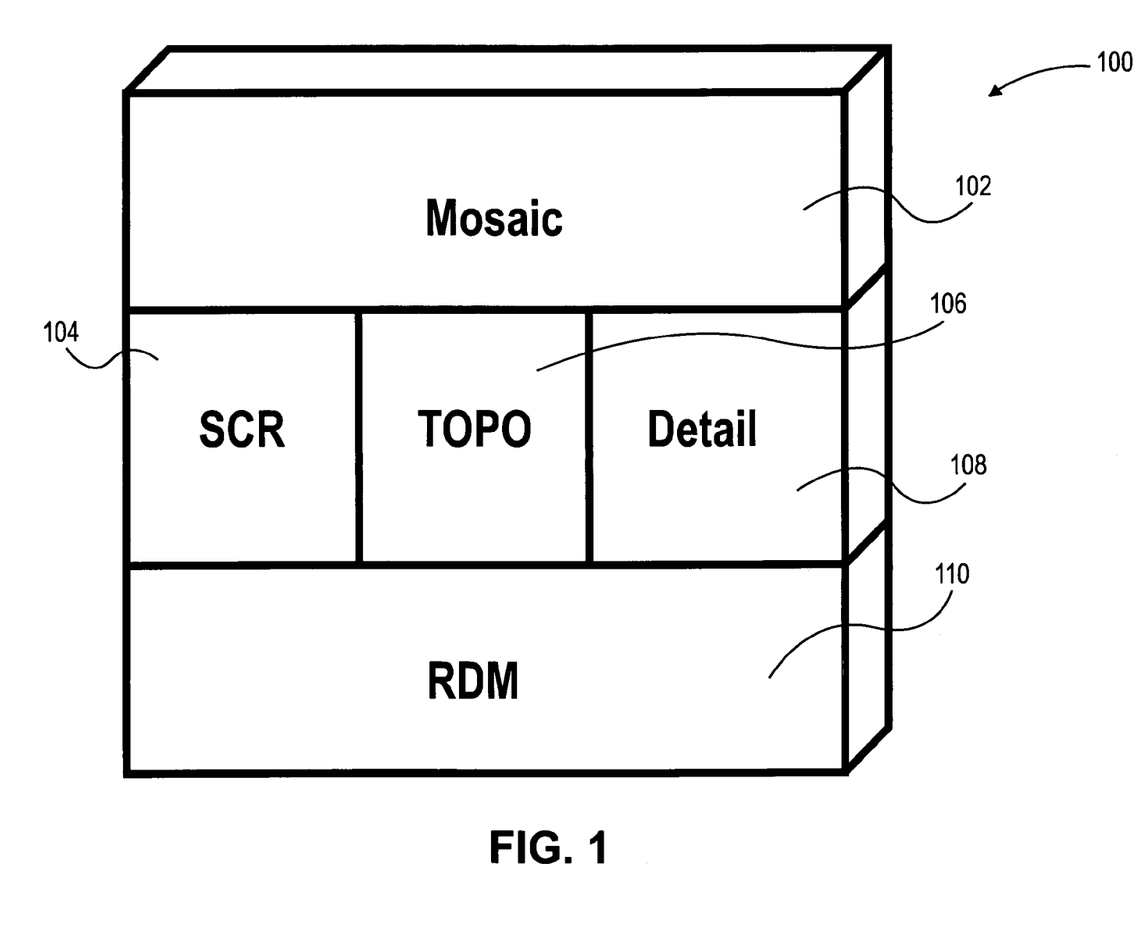
FIG. 1 depicts a high-level schematic of the architecture of the system components.

FIG. 1 depicts the overall architecture of the system 100. The system 100 is comprised of five main components, Mosaic (a command and control supervisor) 102, SCR (a single connection router) 104, TOPO (a topological optimizer) 106, Detail (a geometric detail engine) 108, and RDM (a routing data model) 110.

RDM 110, the Routing Data Model, can store all data relevant to the design, such as information about components, pins, layers and/or any other convenient design-related data. In addition, RDM 110 can store all physical and electrical constraint information related to the design. In one embodiment, the topological data can be stored in the form of a single graph consisting of nodes or points and edges, which are line segments connecting the nodes or points. All of the other components perform their work by manipulating the RDM data model and gradually refining it into a solution.

A RatPath or topological path between two pins consists of an ordered sequence of edges through which the path passes. As routing progresses, the topological model is gradually refined and augmented using any known and/or convenient system or method. By way of example, if RatPaths crossing any particular edge are initially unordered, as routing progresses, the RatPaths would be ordered; and, finally, assigned explicit coordinates where each RatPath should cross an edge.

SCR 104, the Single Connection Router can process one pin-pair at a time to find a new path between two pins. In one embodiment, its method and system include a costed-wavefront expansion engine, which is known in the art, that is topology-based. Topology-based means that the system performs its path seeking on the topological model of the database, and not a geometric or shape-based model. This expansion can proceed from edge to edge across the graph. A solution returned by SCR 104 is a RatPath, which consists of an ordered series of edges connecting a source pin to a target pin.

TOPO 106, the Topological Optimizer, accepts a topological solution and improves it without creating or destroying any paths. In one embodiment, TOPO 106 operates by simultaneously optimizing all constraints, as opposed to processing the constraints one at a time on a per net basis. Each time TOPO 106 is invoked, TOPO 106 modifies the topological solution focusing on improving compliance for one or more constraints without reducing the overall compliance with constraints that were met in the provided solution. For example, TOPO 106 can operate by attempting to improve rule compliance for a single via. To meet the spacing rules for that via, TOPO 106 could move the via to a new location or could move the location of other vias. TOPO 106 could also improve the topological solution near the via by jumping or rerouting existing nets around the other side of an interfering via. In alternate embodiments, TOPO 106 can use any known and/or convenient system or method to improve the rule compliance of the solution.

Detail 108, the Geometric Detail Engine, accepts a topological solution and produces a geometric implementation of that solution. Detail 110 includes geometric push and shove systems and/or methods that are tightly integrated with the constraint-solving system. Although Detail 110 works on creating geometric solutions one pin-pair at a time, it starts with a topological solution known to globally meet all constraints. Its output also meets all constraints globally, but has detailed geometric coordinates for its goal path and any other paths that it modified.

Mosaic 102 is the top-level command and control module that manages the overall routing process. Mosaic 102 manages the many constraints by continually re-evaluating and re-optimizing these constraints on-the-fly as routing progresses towards a solution.

Figure 2:
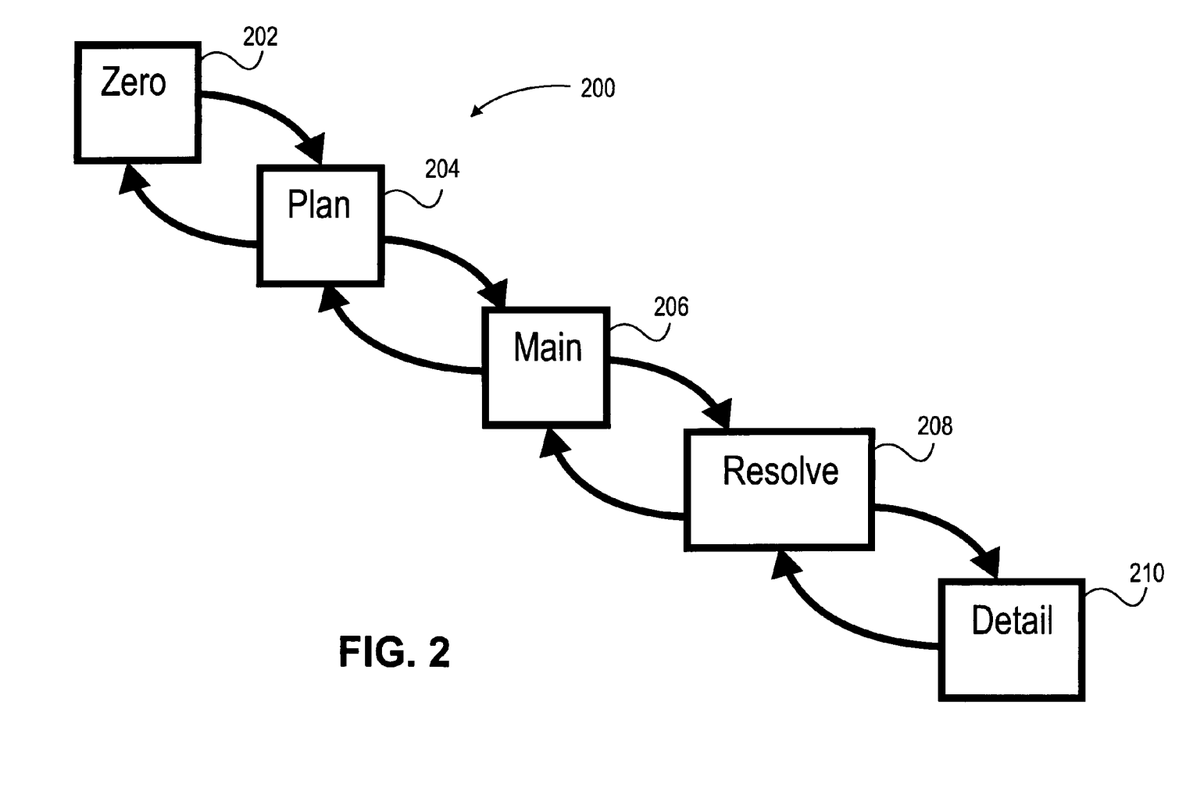
FIG. 2 depicts a flow chart of the operation and interactions of the various components of the system.

FIG. 2 depicts one embodiment of the router 200 which includes five routing phases, Zero 202, Plan 204, Main 206, Resolve 208, and Detail 210 each of which can use the systems SCR 104, TOPO 106, Detail 108 and RDM 110 the operation and interaction of which are globally controlled by Mosaic 102.

In general, a Plan refers to a topology representing approximate flow that meets electrical constraints at the expense of ignoring or failing to meet all physical constraints and a Solution is a more detailed topology graph that attempts to meet all constraints both physical and electrical.

During the Zero Phase 202, the processing focuses on data acquisition. In one embodiment, during the Zero Phase 202 the system can acquire information about the constraints and the general flow of the design. At the Zero Phase 202, the system need not review or obtain layer assignment or details, such as the physical location of vias or vertices. The system seeks a global solution that distributes the routing problem across the design and identifies which constraints will be the most difficult to meet. The identified difficult-to-meet constraints are the constraints that will dictate the next decisions of the system.

There are more than a hundred possible constraints that can be applied to any given pin-pair. Normally, only a few constraints will apply. If the SCR expansion engine had to check for the existence of every rule on every wavefront expansion, the performance would be unacceptable. Further, some rules may apply but be easy to satisfy.

A component of this system 200 is a system and method for managing which constraints need to be processed and a method of processing only those constraints without incurring any overhead for constraints that are not processed.

In one embodiment, each of the many possible constraints includes a "constraint handler". There is also a BaseConstraintHandler, which can be an abstract C++ base class from which all other constraint handlers can be derived or any other convenient designation. When a constraint handler object is created, it registers itself with the expansion engine. During wavefront expansion, the expansion engine calls each of the currently registered constraint handlers and requests they compute their portion of the cost for a particular expansion.

This mechanism separates knowledge of the expansion process from knowledge of the constraint processing. The expansion engine's systems and methods can be improved without modifying any of the constraint handlers. Conversely, new constraint handlers can be added with no changes to the expansion engine. And, there is no processing overhead for constraints that do not apply for the current pin-pair.

Further, in some embodiments, the decision as to which constraints apply can change during the routing. During the first pass of the first Zero Phase 202, all constraints are ignored. If the constraint can be met without actually enforcing it, then that constraint continues to be ignored. For example, if a pin-pair has a constraint that limits its length to 5" and the path selected by the SCR expansion engine happens to be 3" long, then that constraint can be ignored. If at any time during routing, the path selected is 6" long, then Mosaic can begin to apply the constraint. Alternatively, Mosaic can adjust the standard expansion costs (in one embodiment, the cost, which reduces total length) rather than create a constraint handler object.

This decision process continues throughout the Planning, Main and Resolve Phases. Constraints can be dynamically ignored, if they can be easily satisfied, or enforced, if the expansion engine would otherwise not meet this constraint.

During the Plan Phase 204, a topological plan for the entire design is created. The term topological plan means a representation, stored in a topological graph or other convenient format that meets the relevant electrical constraints for a design, but does not necessarily meet all of the physical constraints. For example, the topological plan can include many crossovers and many spacing violations.

In some embodiments, the Plan Phase 204 primarily deals with assigning nets to layers. Many nets have explicit constraints regarding layer assignment. For example, some differential pairs may have been constrained to certain layer pairs in the design specification. Furthermore, in some cases, a user may have suggested a preferred layer assignment for certain key buses. During the Plan Phase 204, pin escapes can also be planned. For example, when large BGA devices are involved, which is extremely common for highly-constrained designs, escaping from the boundaries formed by the BGA balls can be a difficult routing problem. Solutions to these types of problems are referred to as pin escapes. These problems can be made more complicated by multiple constraints. During the Plan Phase 204, channels can be identified as necessary to escape the boundaries. Thus, future channel overload problems can be avoided.

During the topological planning phase, electrical constraints are considered but physical constraints such as spacing are relaxed and signals are allowed to cross.

The significance of routing order is reduced in some embodiments by making the routing order in the early routing passes irrelevant. In particular, during the first pass of Zero Phase 202 and the first pass of Plan Phase 204, the channel overload cost and the crossover costs can be zero. Therefore, the order in which the nets are routed has no effect on the paths that they select. In later passes, however, order is important. As the overload cost is gradually increased, there is a slight preference to pin-pairs that are routed first.

Rather that force the user to assign a routing order and have the system become dependent on the accuracy of that assignment, in some embodiments, the routing order is based on the available tolerance. For example, if a pin-pair has a constraint that its total length cannot exceed 5" and its current topological path is estimated at 3", then it is given a low routing priority. Conversely, if its current topological path is estimated at 4.9", then it is given a very high routing priority.

The topological plan is represented in a graph consisting of nodes and edges. The topological plan for a particular pin-pair is represented as a sequence of edges connecting the source pin's node to the target pin's node. In some embodiments, this sequence of nodes and edges is called a RatPath. Any given pin-pair can have several associated RatPaths, only one of which is called the current RatPath.

Mosaic 102 can call the SCR expansion engine to generate new RatPaths. During the Plan Phase 204, the RatPath has information as to which graph edges it crosses but does not have any information as to its relative order along the graph edge compared to other RatPaths that cross that same graph edge. In effect, this is equivalent to providing a zero crossing cost. In other words, any RatPath in the topological plan stage can freely cross any other RatPath that is also at the topological plan stage. However, that RatPath can never cross any RatPath that the user has identified as locked. In some embodiments, the new RatPath can cross RatPaths that are at the topological solution stage, but can do so only at a very high cost.

In some embodiments, the topological plan continues to be used even during Main Phase 206 when the topological solution is being created. After each set of pin-pairs has been routed at the topological solution stage, the remaining pin-pairs still at the topological plan stage are routed again to eliminate or reduce their number of crossovers with pin-pairs that are now at the topological solution stage.

During the Main Phase 206, a Topological Solution is created. The output of the Plan Phase 204 includes information about which constraints were the most difficult to meet during planning.

During the Main Phase 206, the routing order is very important since the crossover cost is non-zero even on the first pass. However, at this point every net has complete topological planning data received from the Plan Phase 204. Therefore, using the topological planning data to compute the available tolerance is very accurate. Thus, resulting in a routing order superior to what the user is likely to produce manually.

The Main Phase 206 starts by refining the topological graph for the nets identified as including most difficult to meet constraints by the Plan Phase 204. Mosaic 102 then returns the topological graph to the Plan Phase 204 to re-plan and re-optimize the remaining nets.

Mosaic 102 continually implements the Main Phase 206 system and method to add more and more nets to the routed state while continuing to use the Plan Phase 204 to keep the plans intact for all of the nets not yet routed. When the Main Phase 206 and the Plan Phase 204 are unable to determine a solution to a desired routing problem, Mosaic 102 can invoke the Resolve Phase 208.

In some embodiments, both existing and updated/current topological routing models exist simultaneously and are continually updated. Feedback from the Main Phase 206 is used to refine and update the Planning Phase 204 data. Feedback from the Detail Phase 210 is used to refine and update the Main Phase 206 data. For example, any particular graph edge may have nets at all three data representation stages: topological plan, topological solution and geometric layout. The data in the topological plan state has an occupancy effect on the graph edge. The data at the topological solution state have both occupancy and order information. The data at the geometric state have occupancy, order and location information.

Typically in a router, each wavefront expansion leaves behind a marker, called a "breadcrumb", indicating the direction to the source of that particular expansion.

In some embodiments, the same location can have several breadcrumbs. The decision as to whether or not to leave additional breadcrumbs is left to the constraint handlers.

For example, consider the case where a pin-pair has a match via constraint. An earlier pass would have determined the appropriate number of vias. Assuming that Mosaic 102 determined that all pin-pair's with this match constraint should have exactly two vias, Mosaic 102 can then instruct SCR to create a match via constraint handler object with a parameter of "2". When this constraint handler registers itself with the expansion engine, it will request one slot of scratch space in every breadcrumb to be allocated to it.

All wavefront expansion will initially have zero vias. Therefore, the match-via constraint handler will store zero in its field in the breadcrumb. Later, some of the expansions will have zero vias, some will have one via and some will have two vias. This information will be stored in each of the breadcrumbs. If, during expansion, a particular expansion is considered that has one via and there is already a breadcrumb with one via but at a lower cost, then that expansion will not continue and will be discarded. Conversely, if the existing breadcrumb had a via count of zero, then the match-via constraint handler would request a new breadcrumb be created in addition to the existing breadcrumb because either of the breadcrumbs might eventually be the winning breadcrumb. In this way, the maximum number of breadcrumbs per location is not predetermined. The maximum number depends on the complexity of the constraints for the current pin-pair. Simple nets with easily met constraints might have a maximum of 1 breadcrumb per location. Nets with complicated, hard-to-meet constraints can have many breadcrumbs for each location. The decision can be made dynamically by the constraint handlers.

After the topological plan has been created, the Main Phase 206 begins to create a topological solution. The Main Phase 206 will attempt to create topological solutions for sets of pin pairs, addressing one set of pin pairs at a time (the current set), until all pin pair sets have topological solutions.

In the Main Phase 206, the crossover cost for routing a RatPath from the current pin pair set over an existing RatPath is very high. The crossover cost for other pin-pairs in the current set is moderate. The crossover cost for pin-pairs that are still at the topological plan stage is zero. The actual costs can be dynamically computed by Mosaic 102 based on a variety of factors such as the pass number, the overall design density, the number of pin-pairs already at the topological solution stage or any other convenient factors, using any known and/or convenient method or system.

Because a topological plan has already been created for each pin-pair, the Main Phase 206 is able to use this information as the preferred path for that pin-pair. The Main Phase 206 can dynamically lower the costs of crossing any graph edges that appeared in its preferred path. This biases the topological path toward following the topological plan but does not prevent it from searching alternative paths.

By adjusting the cost settings, the same topological graph and the same expansion engine can be used to find both topological plan paths and topological solutions.

Many nets have constraints that require their total length to be the same as the length for other related nets. For example, many buses have a requirement that the length of each pin-pair for the entire bus match the length for the corresponding pin-pairs of all other members of that bus. Further, it is common for some buses to have match length requirements with other buses.

In some embodiment, elongation of the path is avoided by setting a goal length for each net. This goal length is first computed during the Zero Phase 202 then is updated during the Plan Phase 204. Nets that exceed this goal get assigned a constraint handler to keep their length down to the goal. Nets that are lower than the goal length get an elongation assignment.

Any net that needs elongation (either from a min length requirement or a match length mismatch) gets an "elongation assignment". This indicates not just the length to be added but the approximate location where it should be added. The location selected is based on the existing occupancy and capacity of the Tile objects. In one embodiment, tiles with the least predicted occupancy get elongation assignments first.

In some embodiments, during Plan Phase 204 and Main Phase 206, elongation assignments are made whenever the RatPath length is significantly less that the minimum length constraint or is significantly less than the goal length for a match length constraint. During the Detail Phase 210, the extra wire segments (to implement elongation) are placed in the specified Tiles.

During the Resolve Phase 208, specific design rules are addressed with more powerful, and sometimes slower, routing systems and methods. For example, if a bottleneck—too many connections running through a particular graph edge—cannot be resolved by traversing the edge, then a special purpose edge resolve system and method can be invoked to solve that specific problem. The edge resolution system and method can use SCR and TOPO and other known and/or convenient systems and methods either inside the system 100 or outside the system 100 to resolve the conflict.

During the Detail Phase 210, a Geometric Solution is created. A geometric solution differs from a topological solution in that it includes specific coordinate locations for each wire segment and each via pad. Any one geometric solution always corresponds to exactly one topological solution. Conversely, a topological solution can have many different geometric solutions that implement it.

Once all constraints have been met at the global level in a topological solution, Mosaic uses the Detail 210 subsystem to create wire segments and via pads for all or some nets in the design. The input to the Detail 210 engine is a small portion of one particular pin-pair path. Because the Detail 210 engine has a high confidence that a geometric solution exists and because it is focused on only a small geometrical subset of the design, it can use highly accurate systems and methods that would be computationally too expensive for a traditional geometric detail router. For example, there are no artificial limits to how many segments and vias can be moved in order to find a solution meeting the real limits (physical and electrical constraints).

The Detail Phase 210 adds geometric information to the topological graph to complete the routing solution. This geometric information consists of wire segments and via pads.

Since the Detail 210 engine has a complete topological solution before it begins, it uses this information when generating the geometric representation. The locations at which the RatPath crosses the graph edges are used to create a first approximation for the wire segments. Then, a traditional push and shove algorithm is used to move these wire segments away from other wire segments or to move other wire segments away from it.

For performance reasons, the Detail 210 engine can work with a single Tile a small rectangular partition of the design or a larger area. This allows several Detail 210 engines to run concurrently on a symmetric multiprocessor system.

Once a complete geometric solution has been found, it can be sent to a PCB Layout system for final processing.

Figure 3:
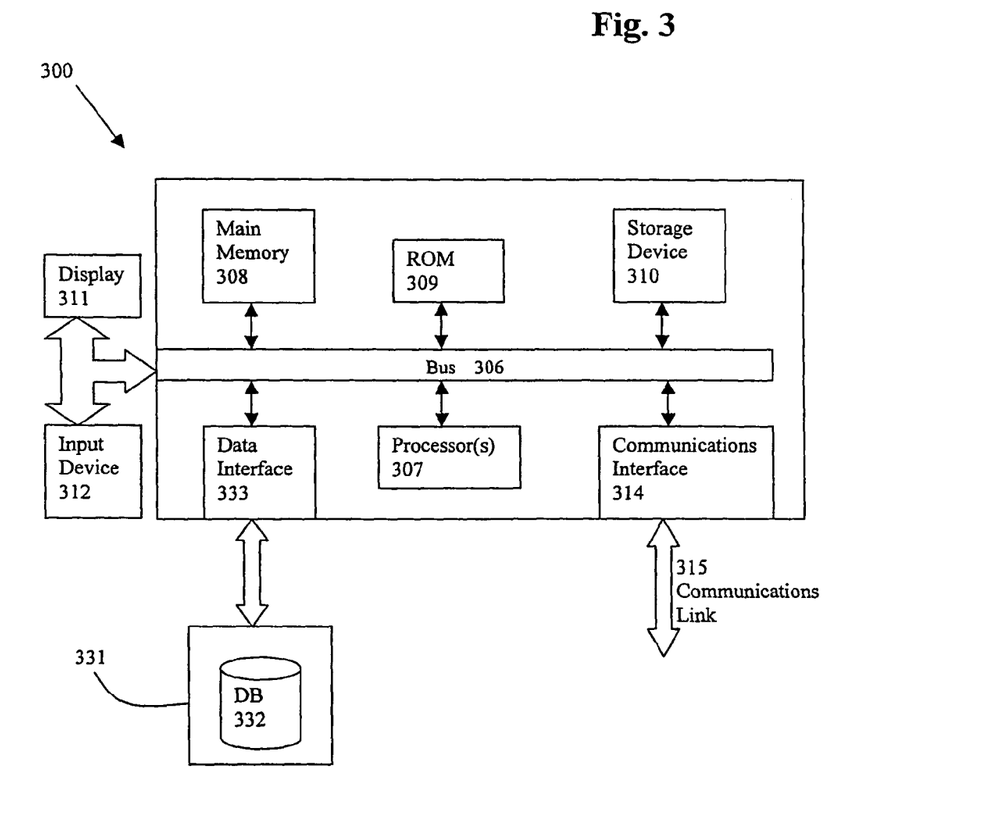
FIG. 3 depicts a computerized system on which a method for PCB routing can be implemented.

With reference to FIG. 3, the execution of the sequences of instructions required to practice the embodiments may be performed by a computer system 300 as shown in FIG. 3. In an embodiment, execution of the sequences of instructions is performed by a single computer system 300. According to other embodiments, two or more computer systems 300 coupled by a communication link 315 may perform the sequence of instructions in coordination with one another. Although a description of only one computer system 300 will be presented below, however, it should be understood that any number of computer systems 300 may be employed to practice the embodiments.

A computer system 300 according to an embodiment will now be described with reference to FIG. 3, which is a block diagram of the functional components of a computer system 300. As used herein, the term computer system 300 is broadly used to describe any computing device that can store and independently run one or more programs.

Each computer system 300 may include a communication interface 314 coupled to the bus 306. The communication interface 314 provides two-way communication between computer systems 300. The communication interface 314 of a respective computer system 300 transmits and receives electrical, electromagnetic or optical signals, that include data streams representing various types of signal information, e.g., instructions, messages and data. A communication link 315 links one computer system 300 with another computer system 300. For example, the communication link 315 may be a LAN, in which case the communication interface 314 may be a LAN card, or the communication link 315 may be a PSTN, in which case the communication interface 314 may be an integrated services digital network (ISDN) card or a modem, or the communication link 315 may be the Internet, in which case the communication interface 314 may be a dial-up, cable or wireless modem.

A computer system 300 may transmit and receive messages, data, and instructions, including program, i.e., application, code, through its respective communication link 315 and communication interface 314. Received program code may be executed by the respective processor(s) 307 as it is received, and/or stored in the storage device 310, or other associated non-volatile media, for later execution.

In an embodiment, the computer system 300 operates in conjunction with a data storage system 331, e.g., a data storage system 331 that contains a database 332 that is readily accessible by the computer system 300. The computer system 300 communicates with the data storage system 331 through a data interface 333. A data interface 333, which is coupled to the bus 306, transmits and receives electrical, electromagnetic or optical signals, that include data streams representing various types of signal information, e.g., instructions, messages and data. In embodiments, the functions of the data interface 333 may be performed by the communication interface 314.

Computer system 300 includes a bus 306 or other communication mechanism for communicating instructions, messages and data, collectively, information, and one or more processors 307 coupled with the bus 306 for processing information. Computer system 300 also includes a main memory 308, such as a random access memory (RAM) or other dynamic storage device, coupled to the bus 306 for storing dynamic data and instructions to be executed by the processor (s) 307. The main memory 308 also may be used for storing temporary data, i.e., variables, or other intermediate information during execution of instructions by the processor(s) 307.

The computer system 300 may further include a read only memory (ROM) 309 or other static storage device coupled to the bus 306 for storing static data and instructions for the processor(s) 307. A storage device 310, such as a magnetic disk or optical disk, may also be provided and coupled to the bus 306 for storing data and instructions for the processor(s) 307.

A computer system 300 may be coupled via the bus 306 to a display device 311, such as, but not limited to, a cathode ray tube (CRT), for displaying information to a user. An input device 312, e.g., alphanumeric and other keys, is coupled to the bus 306 for communicating information and command selections to the processor(s) 307.

According to one embodiment, an individual computer system 300 performs specific operations by their respective processor(s) 307 executing one or more sequences of one or more instructions contained in the main memory 308. Such instructions may be read into the main memory 308 from another computer-usable medium, such as the ROM 309 or the storage device 310. Execution of the sequences of instructions contained in the main memory 308 causes the processor (s) 307 to perform the processes described herein. In alternative embodiments, hard-wired circuitry may be used in place of or in combination with software instructions. Thus, embodiments are not limited to any specific combination of hardware circuitry and/or software.

The term "computer-usable medium," as used herein, refers to any medium that provides information or is usable by the processor(s) 307. Such a medium may take many forms, including, but not limited to, non-volatile, volatile and transmission media. Non-volatile media, i.e., media that can retain information in the absence of power, includes the ROM 309, CD ROM, magnetic tape, and magnetic discs. Volatile media, i.e., media that can not retain information in the absence of power, includes the main memory 308. Transmission media includes coaxial cables, copper wire and fiber optics, including the wires that comprise the bus 306. Transmission media can also take the form of carrier waves; i.e., electromagnetic waves that can be modulated, as in frequency, amplitude or phase, to transmit information signals. Additionally, transmission media can take the form of acoustic or light waves, such as those generated during radio wave and infrared data communications.

In the foregoing specification, the embodiments have been described with reference to specific elements thereof. It will, however, be evident that various modifications and changes may be made thereto without departing from the broader spirit and scope of the embodiments. For example, the reader is to understand that the specific ordering and combination of process actions shown in the process flow diagrams described herein is merely illustrative, and that using different or additional process actions, or a different combination or ordering of process actions can be used to enact the embodiments. The specification and drawings are, accordingly, to be regarded in an illustrative rather than restrictive sense.

What is claimed is:

1. A machine implemented method for automated PCB routing comprising:

receiving electrical design data, including electrical constraints;

receiving physical design data, including physical constraints;

determining, by using a processor, a PCB routing solution complying with said electrical design data and said physical design data, wherein the PCB routing solution is used at least in part to generate a global flow plan for the automated PCB routing and is based at least in part upon a set of electrical and physical constraints that changes during the act of determining the PCB routing solution;

determining a topological solution based at least in part upon said PCB routing solution and said electrical constraints and said physical constraints;

determining if optimizing said topological solution can be implemented based at least in part upon said electrical constraints and said physical constraints;

updating said topological solution, if optimizing results in a superior topological solution based at least in part upon a criteria;

resolving any portion of the topological solution violating said physical constraints;

updating said topological solution;

optimizing said updated topological solution;

determining a geometric solution based at least in part upon the optimized, updated, topological solution; and storing the set of electrical and physical constraints in non-transitory computer-usable medium or displaying the set of electrical and physical constraints on a display device.

2. The method of claim 1 wherein the act of determining the PCB routing solution further comprises:
  determining if an electrical constraint is met based at least in part upon a first layout without specific imposition of said electrical constraint;
  determining if a physical constraint is met based at least in part upon a first layout without specific imposition of said physical constraint; and
  identifying a set of electrical constraints and physical constraints for which a first layout results in violation of said identified electrical constrains and said physical constraints.

3. The method of claim 1, wherein said electrical constraints include layer assignment data.

4. The method of claim 3 further comprising determining pin escapes.

5. The method of claim 1 further comprising:
  revising said optimized, updated, topological solution;
  determining if said revised, optimized, updated, topological solution is superior to said optimized, updated, topological solution based at least in part upon the criteria; and
  updating said detail solution if said revised, optimized, updated, topological solution is superior to said optimized, updated, topological solution based at least in part upon the criteria.

6. A system for automated PCB routing comprising:
  a processor programmed for receiving electrical design data, including electrical constraints, and for receiving physical design data, including physical constraints;
  wherein said processor performs:
    determining a PCB routing solution complying with said electrical design data and said physical design data, wherein the PCB solution is used at least in part to generate a global flow plan for the automated PCB routing and is based at least in part upon a set of electrical and physical constraints that changes during the act of determining the PCB routing solution;
    determining a topological solution based at least in part upon said PCB routing solution, said electrical constraints and said physical constraints;
    determining if optimizing said topological solution can be implemented based least in part upon said electrical constraints and said physical constraints;
    updating said topological solution, if optimizing results in a superior topological solution based least in part upon a criteria;
    resolving any portion of the topological solution violating said physical constraints;
    updating said topological solution;
    optimizing said updated topological solution;
    determining a geometric solution based at least in part upon an optimized, updated, topological solution; and
  non-transitory computer-usable medium for storing the set of electrical and physical constraints or a display device for displaying the set of electrical and physical constraints.

7. The system of claim 6, wherein said processor is further programmed for:
  determining if an electrical constraint is met based on a first layout without specific imposition of said electrical constraint;
  determining if a physical constraint is met based on a first layout without specific imposition of said physical constraint; and
  identifying a set of electrical constraints and physical constraints for which a first layout results in violation of said identified electrical constrains and said physical constraints.

8. The system of claim 6, wherein said electrical constraints include layer assignment data.

9. The system of claim 8 further comprising systems for determining pin escapes.

10. The system of claim 6, wherein the processor is further programmed for:
  revising said optimized, updated, topological solution;
  determining if said revised, optimized, updated, topological solution is superior to said optimized, updated, topological solution based least in part upon a second criteria; and
  updating said detail solution if said revised, optimized, updated, topological solution is superior to said optimized, updated, topological solution based at least in part upon the second criteria.

11. A computer-implemented method for automated PCB routing comprising:
  receiving electrical constraint information and physical constrain information;
  determining a PCB routing solution based at least in part upon said electrical constraint information, wherein the PCB solution is used at least in part to generate a global flow plan for the automated PCB routing;
  determining a topological solution based at least in part upon said PCB routing solution and said at least a portion of physical constraint information;
  optimizing said topological solution, wherein the act of optimizing said topological solution comprises improving said topological solution without creating or destroying paths;
  determining, by using a processor, a geometric solution based at least in part upon said optimized topological solution;
  optimizing said geometric solution; and
  storing the optimized geometric solution in non-transitory computer-usable medium or displaying the optimized geometric solution on a display device.

12. The method of claim 11 further comprising adding geometric information to topological graph for said PCB routing solution.

13. The method of claim 11, further comprising adjusting cost settings to find topological solutions for sets of pin pairs.

14. The method of claim 11 further comprising adding geometric information to topological graph for said PCB routing solution.

15. A system for automated PCB routing comprising:
  a processor programmed for:
    receiving electrical constraint information and physical constrain information;
    determining a PCB routing solution based at least in part upon said electrical constraint information, wherein the PCB solution is used at least in part to generate a global flow plan for the automated PCB routing;
    determining a topological solution based at least in part upon said PCB routing solution and said at least a portion of physical constraint information;
    optimizing said topological solution, the means for optimizing said topological solution comprises means for improving said topological solution without creating or destroying paths;
    determining a geometric solution based at least in part upon said optimized topological solution;
    optimizing said geometric solution; and non-transitory computer-usable medium for storing the optimized geometric solution or a display device for displaying the optimized geometric solution.

16. The system of claim 15, wherein the processor is further programmed for adding geometric information to topological graph for said PCB routing solution.

17. A computer program product comprising non-transitory computer-usable medium having executable code for executing a process by using a processor for automated PCB routing, the process comprising:
   receiving electrical constraint information and physical constrain information;
   determining a PCB routing solution based at least in part upon said electrical constraint information, wherein the PCB routing solution is used at least in part to generate a global flow plan for the automated PCB routing;
   determining a topological solution based at least in part upon said PCB routing solution and said at least a portion of physical constraint information;
   optimizing said topological solution, wherein the act of optimizing said topological solution comprises improving said topological solution without creating or destroying paths;
   determining a geometric solution based at least in part upon said optimized topological solution;
   optimizing said geometric solution; and
   storing the optimized geometric solution or displaying the optimized geometric solution on a display device.

18. A computer program product comprising non-transitory computer-usable medium having executable code for executing a process by using a processor for automated PCB routing, the process comprising:
   receiving electrical design data, including electrical constraints;
   receiving physical design data, including physical constraints;
   determining a PCB routing solution complying with said electrical design data and said physical design data, wherein the PCB solution is used at least in part to generate a global flow plan for the automated PCB routing and is based at least in part upon a set of electrical and physical constraints that changes during the act of determining;
   determining a topological solution based at least in part upon said PCB routing solution, said electrical constraints and said physical constraints;
   determining if optimizing said second topological solution can be implemented based at least in part upon said electrical constraints and said physical constraints;
   updating said second topological solution, if optimizing results in a superior topological solution based at least in part upon a criteria;
   resolving any portion of the topological solution violating said physical constraints;
   updating said topological solution;
   optimizing said updated topological solution;
   determining a geometric solution based at least in part upon an optimized, updated topological solution; and
   storing the set of electrical and physical constraints or displaying the set of electrical and physical constraints on a display device.

19. The computer program product of claim 18, wherein identifying comprises
   determining if an electrical constraint is met based at least in part upon a first layout without specific imposition of said electrical constraint;
   determining if a physical constraint is met based at least in part upon a first layout without specific imposition of said physical constraint; and
   identifying a set of electrical constraints and physical constraints for which a first layout results in violation of said identified electrical constrains and said physical constraints.

20. The computer program product of claim 18 further comprising:
   revising said optimized, updated, topological solution;
   determining if said revised, optimized, updated, topological solution is superior to said optimized, updated, topological solution based at least in part upon the criteria; and
   updating said detail solution if said revised, optimized, updated, topological solution is superior to said optimized, updated, topological solution based at least in part upon the criteria.

* * * * *